United States Patent
Kang et al.

(10) Patent No.: US 7,890,913 B1
(45) Date of Patent: Feb. 15, 2011

(54) WIRE MAPPING FOR PROGRAMMABLE LOGIC DEVICES

(75) Inventors: Byung-Kyoo Kang, Cupertino, CA (US); Toshikazu Endo, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 252 days.

(21) Appl. No.: 12/055,170

(22) Filed: Mar. 25, 2008

(51) Int. Cl.
*G06F 17/50* (2006.01)
(52) U.S. Cl. ...................................... 716/100
(58) Field of Classification Search ............ 716/1, 716/16, 100
See application file for complete search history.

(56) References Cited

U.S. PATENT DOCUMENTS

| | | | |
|---|---|---|---|
| 6,086,629 A | 7/2000 | McGettigan et al. | |
| 6,578,174 B2 | 6/2003 | Zizzo | |
| 6,629,308 B1 | 9/2003 | Baxter | |
| 6,643,836 B2 | 11/2003 | Wheeler et al. | |
| 6,701,501 B2 | 3/2004 | Waters et al. | |
| 6,738,961 B2* | 5/2004 | Snider | 716/128 |
| 7,107,565 B1 | 9/2006 | Lindholm et al. | |
| 7,124,391 B1 | 10/2006 | Patterson | |
| 7,185,306 B1 | 2/2007 | Leventis et al. | |
| 7,486,111 B2* | 2/2009 | Madurawe | 326/38 |
| 7,536,668 B1* | 5/2009 | Reynolds et al. | 716/16 |
| 7,584,448 B1* | 9/2009 | Reynolds et al. | 716/16 |

OTHER PUBLICATIONS

U.S. Appl. No. 11/947,662, submitted for obviousness-type double patenting review. Notice of Allowance received Jul. 12, 2010. Issue fee paid Jul. 12, 2010.

* cited by examiner

*Primary Examiner*—Jack Chiang
*Assistant Examiner*—Suchin Parihar
(74) *Attorney, Agent, or Firm*—Haynes and Boone, LLP (57) ABSTRACT

Various techniques for referencing components of a programmable logic device (PLD) are provided. In one example, a method of referencing wires of a routing graph of a PLD is provided. The routing graph comprises a plurality of routing graph wires and a plurality of routing graph switches corresponding to components of the PLD. The method includes maintaining a plurality of master tiles comprising a plurality of master wires and a plurality of master switches corresponding to the routing graph wires and the routing graph switches, respectively. The method also includes identifying a first one of the routing graph wires. The method further includes mapping the first routing graph wire to a second one of the routing graph wires using at least one of the master wires.

15 Claims, 6 Drawing Sheets

| S | C |
|---|---|
| 0 | (0, 0) |
| 1 | (0, 1) |
| 2 | (3, 1) |

640A

| S | C |
|---|---|
| 0 | (−1, 1) |
| 1 | (0, 0) |
| 2 | (0, 2) |
| 3 | (3, 1) |
| 4 | (0, 3) |

640B

| S | C |
|---|---|
| 0 | (−1, 3) |
| 1 | (0, 0) |
| 2 | (0, 2) |
| 3 | (3, 1) |
| 4 | (0, 3) |

640C

| S | C |
|---|---|
| 0 | (−1, 3) |
| 1 | (0, 0) |
| 2 | (0, 2) |
| 3 | (3, 1) |
| 4 | (0, 3) |

640D

| S | C |
|---|---|
| 0 | (−1, 3) |
| 1 | (0, 0) |
| 2 | (0, 2) |
| 3 | (3, 1) |
| 4 | (0, 4) |

670

| S | C |
|---|---|
| 0 | (3, 1) |
| 1 | (−1, 4) |
| 2 | (0, 0) |
| 3 | (0, 1) |

| IW | MW |
|----|----|
| 0  | (0, 0) |
| 1  | (0, 1) |
| 2  | (1, 0) |
| 3  | (1, 2) |
| 4  | (1, 3) |
| 5  | (2, 0) |
| 6  | (2, 2) |
| 7  | (2, 3) |
| 8  | (3, 0) |
| 9  | (3, 1) |
| 10 | (3, 2) |
| 11 | (3, 3) |
| 12 | (4, 0) |
| 13 | (4, 2) |
| 14 | (4, 4) |
| 15 | (5, 0) |
| 16 | (5, 1) |

| MW | IW |
|----|----|
| 0  | 0  |
| 1  | 1  |

840A

| MW | IW |
|----|----|
| 0  | 2  |
| 1  | −  |
| 2  | 3  |
| 3  | 4  |
| 4  | −  |

840B

| MW | IW |
|----|----|
| 0  | 5  |
| 1  | −  |
| 2  | 6  |
| 3  | 7  |
| 4  | −  |

840C

| MW | IW |
|----|----|
| 0  | 8  |
| 1  | 9  |
| 2  | 10 |
| 3  | 11 |
| 4  | −  |

840D

| MW | IW |
|----|----|
| 0  | 12 |
| 1  | −  |
| 2  | 13 |
| 3  | −  |
| 4  | 14 |

870

| MW | IW |
|----|----|
| 0  | 15 |
| 1  | 16 |

WIRE MAPPING FOR PROGRAMMABLE LOGIC DEVICES

TECHNICAL FIELD

The present invention relates generally to programmable logic devices and, more particularly, to connections between components of programmable logic devices.

BACKGROUND

Programmable logic devices (PLDs), such as field programmable gate arrays (FPGAs) or complex programmable logic devices (CPLDs), may be configured to provide user-defined features. In this regard, PLDs typically include logic blocks that are used to perform various logic operations. These logic blocks may be interconnected through signal paths provided by various wires and switches of the PLD. Interconnections between programmable logic blocks, wires, and switches may be specified by a routing graph of the PLD prepared, for example, by appropriate software running on a computing system.

However, software representations of routing graphs often consume substantial amounts of computing system memory due to the potentially large numbers of programmable logic blocks, wires, switches, and related interconnections identified by the routing graphs. In some cases, such memory sizes may exceed the memory available of a given computing system.

As a result, techniques have been developed to reduce the size of memory used to represent routing graphs. In one such approach, a routing graph may be divided into a small number of sub-graphs which may share similar layout patterns. In this approach, however, boundaries between the sub-graphs may be treated as special conditions which nevertheless require large amounts of memory to represent wires spanning more than one sub-graph.

As a result, there is a need for an improved way of representing interconnections between PLD components. In particular, there is a need for an approach to identifying routing graph interconnections between PLD components that facilitates efficient storage of such information.

SUMMARY

In accordance with one embodiment of the present invention, a method of referencing wires of a routing graph of a programmable logic device (PLD), wherein the routing graph comprises a plurality of routing graph wires and a plurality of routing graph switches corresponding to components of the PLD, includes maintaining a plurality of master tiles comprising a plurality of master wires and a plurality of master switches corresponding to the routing graph wires and the routing graph switches, respectively; identifying a first one of the routing graph wires; and mapping the first routing graph wire to a second one of the routing graph wires using at least one of the master wires.

In accordance with another embodiment of the present invention, a system includes one or more processors; and one or more memories adapted to store a plurality of computer readable instructions which when executed by the one or more processors are adapted to cause the system to perform a method of referencing wires of a routing graph of a programmable logic device (PLD), wherein the routing graph comprises a plurality of routing graph wires and a plurality of routing graph switches corresponding to components of the PLD, the method includes maintaining a plurality of master tiles comprising a plurality of master wires and a plurality of master switches corresponding to the routing graph wires and the routing graph switches, respectively, identifying a first one of the routing graph wires, and mapping the first routing graph wire to a second one of the routing graph wires using at least one of the master wires.

In accordance with another embodiment of the present invention, a system for referencing wires of a routing graph of a programmable logic device (PLD), wherein the routing graph comprises a plurality of routing graph wires and a plurality of routing graph switches corresponding to components of the PLD, includes means for maintaining a plurality of master tiles comprising a plurality of master wires and a plurality of master switches corresponding to the routing graph wires and the routing graph switches, respectively; means for identifying a first one of the routing graph wires; and means for mapping the first routing graph wire to a second one of the routing graph wires using at least one of the master wires.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various techniques described herein, interconnections between components of a programmable logic device (PLD) may be identified in an efficient manner. For example, in one embodiment, a routing graph of a PLD may include a plurality of routing graph tiles prepared from a plurality of tile templates. In this regard, each tile template may include various segmented wires (e.g., wires that are contained within the bounds of each tile template) and switches. The tile templates may be duplicated one or more times to provide a set of routing graph tiles that may be assembled together to provide the routing graph of the PLD.

When considered together in the routing graph, the routing graph tiles provide a collection of routing graph wires and routing graph switches. The routing graph wires may be segmented wires or composite wires (e.g., wires that include two or more segmented wires connected across two or more routing graph tiles). Patterns of connections between the various routing graph wires and switches occurring in the routing graph may be stored in data repositories referred to herein as master tiles. As such, the master tiles include master wires (e.g., data objects of the master tiles used to reference segmented or composite wires of the routing graph) and master switches (e.g., data objects of the master tiles used to reference switches of the routing graph). Additional tables identifying mappings between various wires may also be provided as further described herein.

Using the master tiles and tables, interconnections between wires of the PLD may be conveniently identified to permit a routing graph of the PLD to be efficiently stored in memory. Advantageously, in one embodiment, details regarding the interconnected wires and switches may be stored by master tiles and/or various tables, while individual routing graph tiles may efficiently store component identifiers (e.g., indexes) referenced by the master tiles and tables.

Various tiles, wires, and switches of PLDs are referenced herein and in the accompanying figures by combinations of letters and numbers. As further described herein, such letters and numbers may be used to identify indexes associated with such components of the PLDs. Where appropriate, such indexes are also referred to in portions of the disclosure in a shortened form by omitting the letter prefix (e.g., where the particular index referenced by the shorted form is evident from the context of the disclosure). For example, index "A0" may also be represented as index "0" where appropriate.

Figure 1:
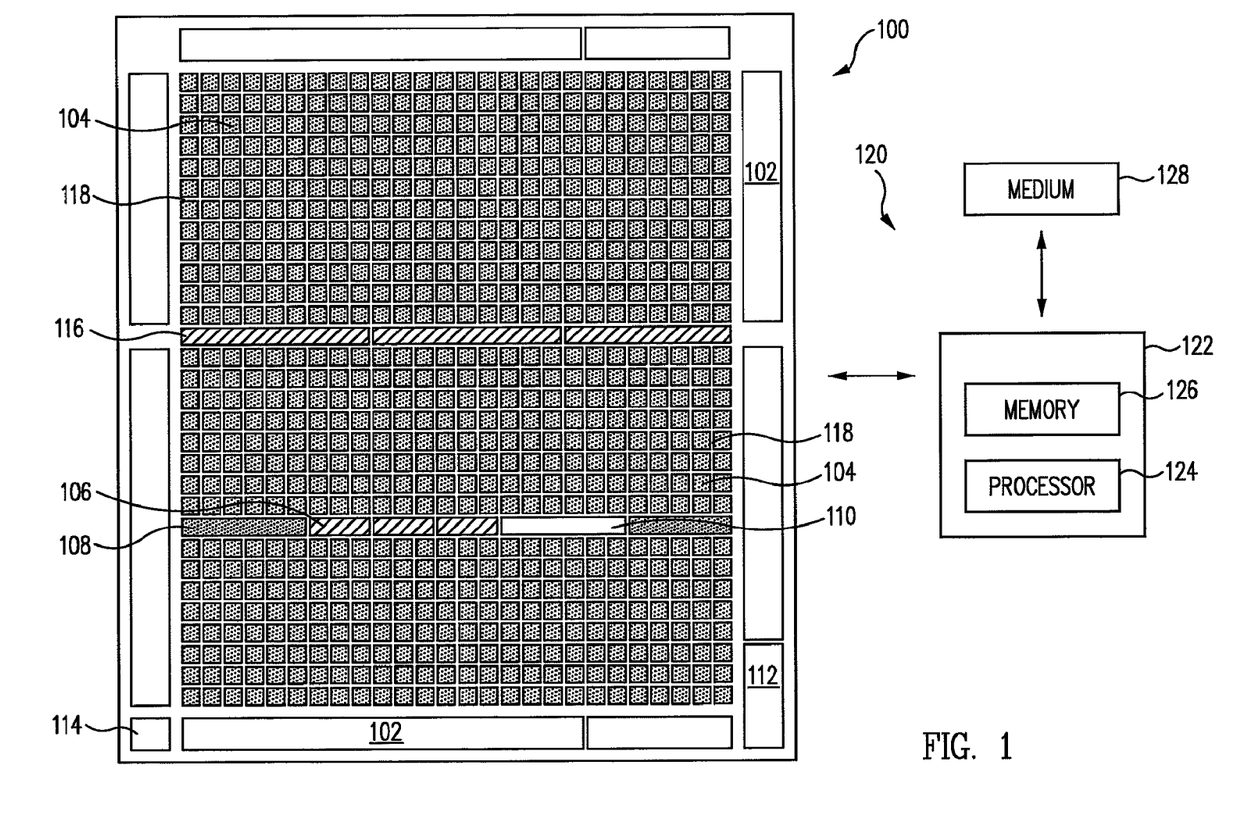
FIG. 1 illustrates a block diagram of a programmable logic device (PLD) and a system for generating configuration data for use with the PLD in accordance with an embodiment of the invention.

FIG. 1 illustrates a block diagram of a programmable logic device (PLD) 100 and a system 120 for generating configuration data for use with PLD 100 in accordance with an embodiment of the invention. PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

System 120 includes a computing device 122 and a computer readable medium 128. As shown, computing device 122 includes a processor 124 and a memory 126. Processor 124 may be configured with appropriate software (e.g., a computer program for execution by a computer) that is stored on computer readable medium 128 and/or in memory 126 to instruct processor 124 to perform one or more of the operations described herein.

In one embodiment, master tiles, master wires, master switches, tables, and/or other data described herein may be stored on computer readable medium 128 and/or in memory 126. For example, in such an embodiment, means such as processor 124 configured with such software may be used for maintaining a plurality of master tiles comprising a plurality of master wires and a plurality of master switches corresponding to a plurality of routing graph wires and a plurality of routing graph switches, respectively, identifying a first one of the routing graph wires, and mapping the first routing graph wire to a second one of the routing graph wires using at least one of the master wires.

Processor 124 and memory 126 may be implemented in accordance with any appropriate components that may be used to provide computing system 120. Similarly, computer readable medium 128 may be implemented using any appropriate type of machine-readable medium used to store software. System 120 may be implemented to provide configuration data prepared by system 120 to PLD 100 through, for example, configuration port 112.

PLD 100 may be implemented as a plurality of tiles, with each tile corresponding to a portion of the device area provided by PLD 100. A small number of tile templates may be used to identify various programmable logic blocks 104 and routing resources 118 of PLD 100. Each of these tile templates may be duplicated to provide a plurality of tiles that are collectively used to implement programmable logic blocks 104 and routing resources 118 of PLD 100. For example, in one embodiment, such tiles may be implemented as a grid of approximately 200 tiles by approximately 200 tiles.

Figure 2:
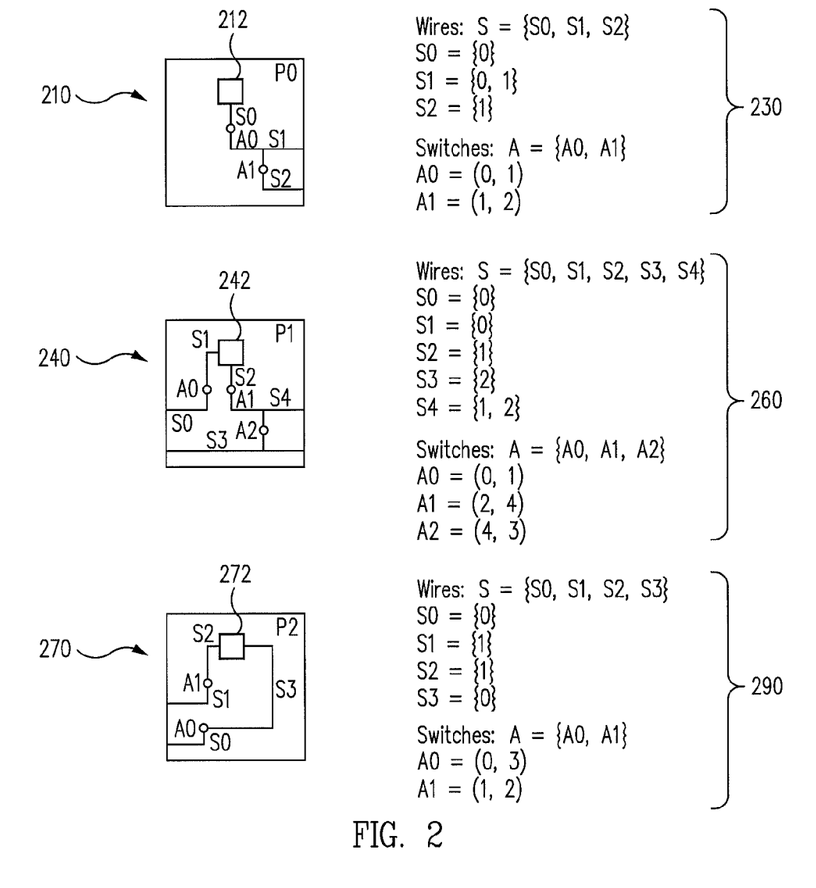
FIG. 2 illustrates a plurality of tile templates in accordance with an embodiment of the invention.

FIG. 2 illustrates a plurality of tile templates 210 (labeled P0), 240 (labeled P1), and 270 (labeled P2) that may be used to implement programmable logic blocks 104 and routing resources 118 of PLD 100 in accordance with an embodiment of the invention. For example, tile template 210 includes a programmable logic block 212 that may be configured to implement look up tables (LUTs), registers, multiplexers, and other components. Tile template 210 also includes switches A0 and A1, and segmented wires S0, S1, and S2, which collectively may be used to provide part of routing resources 118 of PLD 100. Each of switches A0 and A1 may be used to selectively enable and disable connections between two segmented wires. For example, switch A0 may be used to connect segmented wires S0 and S1. Similarly, switch A1 may be used to connect segmented wires S1 and S2.

As shown in FIG. 2, tile template 240 includes a programmable logic block 242, switches A0, A1, and A2, and segmented wires labeled S0, S1, S2, S3, and S4. Similarly, tile template 270 includes a programmable logic block 272, switches A0 and A1, and segmented wires S0, S1, S2, and S3.

The particular segmented wires and switches associated with each of tile templates 210, 240, and 270 are further identified by sets 230, 260, and 290, respectively. Specifically, each segmented wire of tile templates 210, 240, and 270 is identified in corresponding sets 230, 260, and 290 by its connected switches. For example, segmented wire S0 of tile template 210 is connected to switch A0 and is therefore identified in set 230 as: S0={0}; segmented wire S1 of tile template 210 is connected to switches A0 and A1 and is therefore identified in set 230 as: S1={0, 1}; segmented wire S2 of tile template 210 is connected to switch A1 and is therefore identified in set 230 as: S2={1}. Segmented wires of tile templates 240 and 270 are similarly identified in sets 260 and 290, respectively.

Also, each switch of tile templates 210, 240, and 270 is identified in corresponding sets 230, 260, and 290 by its connected segmented wires. For example, switch A0 of tile template 210 is connected to segmented wires S0 and S1 and is therefore identified in set 230 as: A0=(0, 1); switch A1 of tile template 210 is connected to segmented wires S1 and S2 and is therefore identified in set 230 as: A1=(1, 2). Switches of tile templates 240 and 270 are similarly identified in sets 260 and 290, respectively.

As also shown in FIG. 2, some of the segmented wires of tile templates 210, 240, and 270 are implemented as substantially straight wires connecting two circuit elements (for example, segmented wire S0 of tile template 210). Other segmented wires extend in a plurality of directions (for example, segmented wires S1 and S2 of tile template 210).

As further shown in FIG. 2, some of the segmented wires of tile templates 210, 240, and 270 are contained locally within each tile template. These wires are also referred to herein as local segmented wires. For example, tile template 210 includes local segmented wire S0, tile template 240 includes local segmented wires S1 and S2, and tile template 270 includes local segmented wires S2 and S3.

Other segmented wires of tile templates 210, 240, and 270 extend to the edges of their associated tile templates and may be used to connect with wires of other tile templates. These wires are also referred to herein as boundary segmented wires. For example, tile template 210 includes boundary segmented wires S1 and S2, tile template 240 includes boundary segmented wires S0, S3, and S4, and tile template 270 includes boundary segmented wires S0 and S1.

Figure 3:
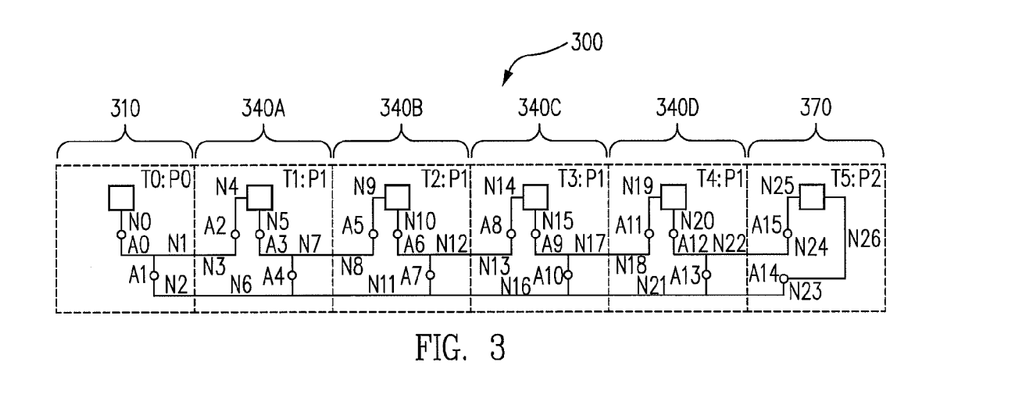
FIG. 3 illustrates a routing graph identifying a plurality of segmented wires in accordance with an embodiment of the invention.

Each of tile templates 210, 240, and 270 may be duplicated to provide a plurality of tiles that are used to provide programmable logic blocks 104 and routing resources 118 of PLD 100. In this regard, FIG. 3 illustrates a routing graph 300 of a plurality of tiles 310, 340A-D, and 370 (which are also referred to as routing graph tiles) in accordance with an embodiment of the invention. In one embodiment, tiles 310, 340A-D, and 370 may be used to implement at least a portion of programmable logic blocks 104 and routing resources 118 of PLD 100.

Upon review of FIGS. 2 and 3, it will be appreciated that tile templates 210, 240, and 270 have been used to implement tiles 310, 340A-D, and 370. For example, tile 310 (labeled T0:P0) corresponds to tile template 210, tiles 340A-D (labeled T1:P1 to T4:P1) correspond to tile template 240, and tile 370 (labeled T5:P2) corresponds to tile template 270. Accordingly, each of tiles 310, 340A-D, and 370 will have the wiring layout and components of their associated tile templates 210, 240, and 270, respectively. However, as shown in FIG. 3, the segmented wires (also referred to as routing graph wires) and switches (also referred to as routing graph switches) provided in tiles 310, 340A-D, and 370 have been renumbered as segmented wires N0-N26 and switches A0-A15, respectively, thus uniquely identifying each segmented wire and switch in routing graph 300.

FIGS. 4-8 further described herein identify various techniques which may be used to identify the information set forth in FIGS. 2 and 3. Appropriate software may be used to prepare information set forth in FIGS. 4-8. For example, in one embodiment, processor 124 of computing device 122 may be configured with appropriate software to prepare routing graph 400, master tiles 510, 540, and 570 (including associated sets 515, 545, and 575 as well as master wire mapping tables 520, 550, and 580), tables 610, 640A-D, and 670, table 700, and tables 810, 840A-D, and 870 using template tiles 210, 240, and 270 and routing graph 300.

Figure 4:
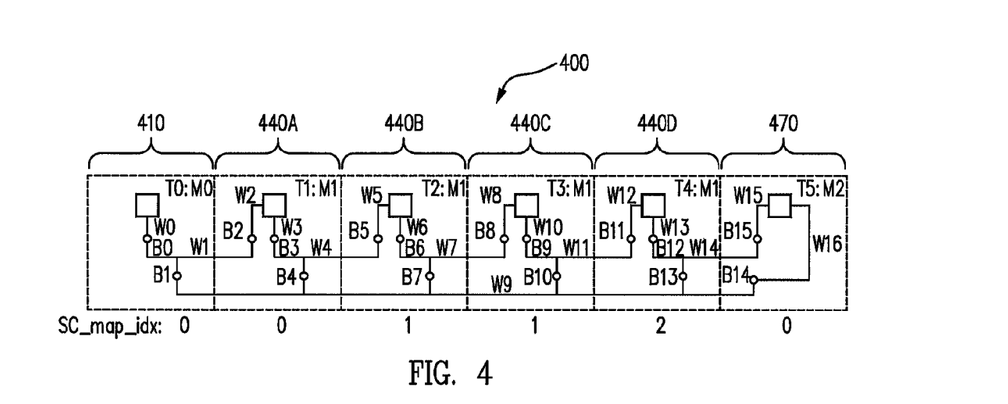
FIG. 4 illustrates a routing graph identifying a plurality of segmented wires and a plurality of composite wires in accordance with an embodiment of the invention.

FIG. 4 illustrates a routing graph 400 identifying a plurality of segmented wires and a plurality of composite wires in accordance with an embodiment of the invention. Routing graph 400 includes tiles 410, 440A-D, and 470 which are also referred to as routing graph tiles. It will be appreciated that tiles 410, 440A-D, and 470 of routing graph 400 correspond to the layout provided by tiles 310, 340A-D, and 370 of routing graph 300. However, in routing graph 400, switches A0-A15 have been renumbered as switches B0-B15 which are also referred to as routing graph switches.

Also in routing graph 400, wires N0-N26 have been renumbered as wires W0-W16 which are also referred to as routing graph wires. Upon inspection of FIG. 4, it will be appreciated that routing graph 400 identifies interconnected segmented wires spanning multiple tiles as composite wires. For example, interconnected segmented wires N1 and N3 of routing graph 300 have been renumbered as a single composite wire W1 in routing graph 400. Such composite wires may be identified in accordance with any desired technique. For example, in one embodiment, techniques such as those described in U.S. patent application Ser. No. 11/947,662 filed Nov. 29, 2007 entitled "Composite Wire Indexing For Programmable Logic Devices" which is hereby incorporated by reference may be used to identify such composite wires.

As shown in FIG. 4, each of tiles 410, 440A-D, and 470 has an associated tile index (e.g., T0, T1-T4, and T5, respectively, which may also be represented as 0, 1-4, and 5, respectively). As also shown in FIG. 4, each of tiles 410, 440A-D, and 470 has an associated map index (labeled "sc_map_idx").

Figure 5:
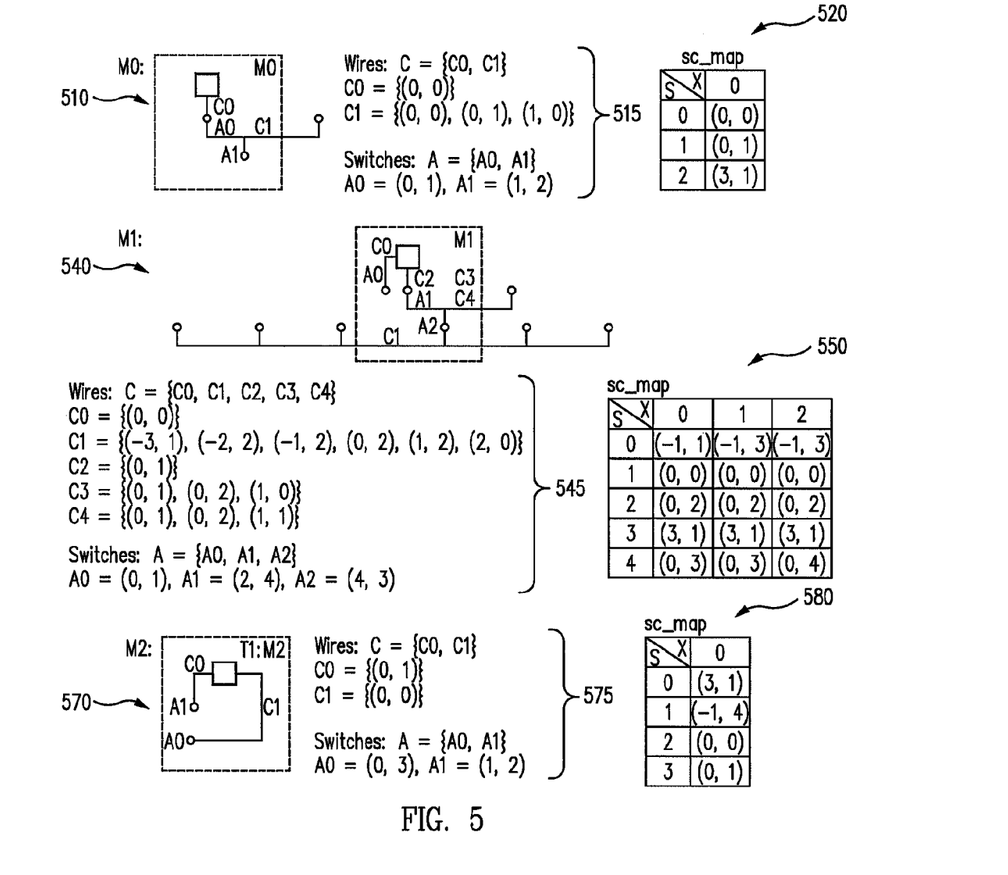
FIG. 5 illustrates a plurality of master tiles and associated master wire mapping tables in accordance with an embodiment of the invention.

FIG. 5 illustrates a plurality of master tiles 510, 540, and 570, and associated master wire mapping tables 520, 550, and 580, respectively, in accordance with an embodiment of the invention. Master tiles 510, 540, and 570 may be used to identify wires and switches of tiles 410, 440A-D, 470 of routing graph 400, respectively. For example, master tile 510 (labeled M0) may be used to identify wires and switches of tile 410, master tile 540 (labeled M1) may be used to identify wires and switches of tiles 440A-D, and master tile 570 (labeled M2) may be used to identify wires and switches of tile 470.

Each of master tiles 510, 540, and 570 may be associated with a position of one of the routing graph tiles of FIG. 4. Master tiles 510, 540, and 570 may reference components of routing graph 400 relative to such positions. For example, in the embodiments illustrated in FIGS. 4 and 5, master tile 510 is associated with the position of tile 410, master tile 540 is associated with the position of tile 440C, and master tile 570 is associated with the position of tile 470.

Accordingly, in cases where a master tile is used to identify components of a plurality of routing graph tiles (for example, where master tile 540 is used to identify components of tiles 440A-D), the master tile may identify wires of the routing graph tiles at least in part by the relative position of the wires to an identified one of the routing graph tiles. In one embodiment, such an identified one of the routing graph tiles (i.e., the tile with which the position of the master tile is associated) may be located substantially in the middle of the longest composite wire spanning the plurality of routing graph tiles. For example, in the embodiments described in FIGS. 4 and 5, tile 440C may be used to determine relative positions of routing graph wires within routing graph 400 identified by master tile 540. In other embodiments, other tiles may be used to determine relative positions (for example, an individual tile of a routing graph that is unique and may be found through inspection of the routing graph).

Master tiles 510, 540, and 570 identify various master wires and master switches corresponding to the routing graph wires and routing graph switches of routing graph 400. However, as shown in FIG. 5, the master wires of master tiles 510, 540, and 570 have been renumbered such that each master tile has a set of master wires numbered C0-C1 or C0-C4. As also shown in FIG. 5, the master switches of master tiles 510, 540, and 570 have been numbered in accordance with the numbering of the switches in template tiles 210, 240, and 270, respectively.

In sets 515, 545, and 575, master wires of master tiles 510, 540, and 570 are identified by sets of ordered pairs corresponding to the routing graph switches to which the routing graph wires represented by the master wires are connected. In one embodiment, these ordered pairs may be in the form (a, b), wherein "a" corresponds to a distance of a routing graph switch in numbers of tiles relative to the routing graph tile with which the position of the master tile is associated (e.g., with positive numbers indicating numbers of tiles in a rightward direction relative to the master tile, and negative numbers indicating numbers of tiles in a leftward direction relative to the master tile), and wherein "b" identifies a master switch index which is the number of the master switch within the master tile corresponding to a routing graph switch of the tile identified by "a" in the ordered pair.

For example, in set 515 of master tile 510, master wire C0 is identified by ordered pair (0, 0) which indicates that master wire C0 is connected to master switch A0 of master tile 510. Master wire C1 of master tile 510 is identified by ordered pairs (0, 0), (0, 1), and (1, 0) which indicates that master wire C1 of master tile 510 is connected to master switch A0 of master tile 510, master switch A1 of master tile 510, and master switch A0 of master tile 540 (e.g., master tile 510 is associated with the position of routing graph tile 410; routing graph tile 440A is located a distance of one tile to the right of routing graph tile 410; master tile 540 is associated with routing graph tile 440A; therefore, master switch A0 of master tile 540 is identified by this ordered pair). Other wires of master tiles 540 and 570 may be similarly identified. It will be appreciated that such representations of the various wires of master tiles 510, 540, and 570 advantageously permit composite wires spanning multiple routing graph tiles to be conveniently represented through a plurality of ordered pairs.

As previously discussed, the master switches of master tiles 510, 540, and 570 have been numbered in accordance with the numbering of the switches in template tiles 210, 240, and 270, respectively. In sets 515, 545, and 575, the master switches of master tiles 510, 540, and 570 are identified by sets of ordered pairs corresponding to segmented wires of template tiles 210, 240, and 270 to which corresponding switches of template tiles 210, 240, and 270 are connected, respectively. In one embodiment, these ordered pairs may be in the form (c, d), wherein "c" and "d" correspond to wire indexes of segmented wires of a corresponding template tile of FIG. 2. For example, it will be appreciated that the ordered pairs used to identify switches of master tiles 510, 540, and 570 in FIG. 5 correspond to the ordered pairs used to identify switches of template tiles 210, 240, and 270 of FIG. 2, respectively.

Figure 6:
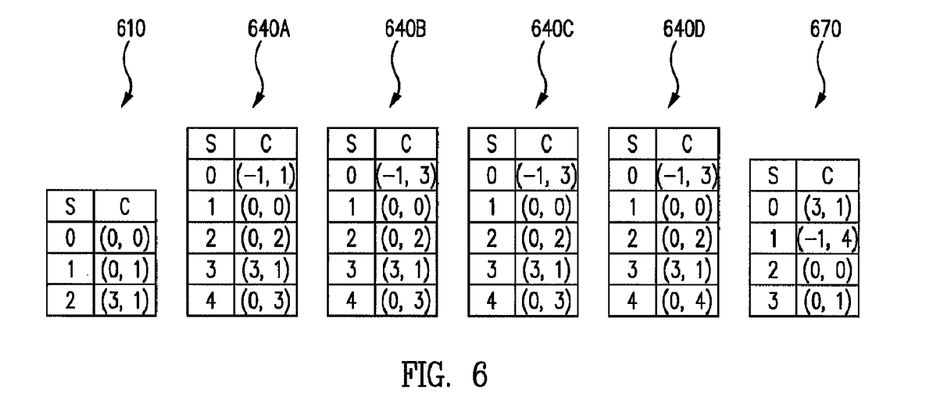
FIG. 6 illustrates a plurality of tables for mapping segmented wires to composite wires in accordance with an embodiment of the invention.

FIG. 6 illustrates a plurality of tables 610, 640A-D, and 670 for mapping segmented wires to composite wires in accordance with an embodiment of the invention. Tables 610, 640A-D, and 670 are associated with tile templates 210, 240, and 270, respectively, tiles 310, 340A-D, and 370, respectively, and tiles 410, 440A-D, and 470, respectively.

Each of tables 610, 640A-D, and 670 includes: a column (labeled "S") of wire indexes of segmented wires of tile templates 210, 240, and 270; and a column (labeled "C") of ordered pairs used to identify composite wires of which the wires identified by column S are a part.

The ordered pairs of each column C may be in the form (e, f), wherein "e" corresponds to a distance in numbers of tiles relative to a tile of routing graph 400 associated with the table (e.g., with positive numbers indicating numbers of tiles in a rightward direction relative to the tile, and negative numbers indicating numbers of tiles in a leftward direction relative to the tile), and wherein "f" identifies a master wire index which is the number of the master wire within the master tile corresponding to the tile of routing graph 400 identified by "e" of the ordered pair.

In various embodiments, the first number of the ordered pair (e.g., tile distance) may alternatively be used to identify a tile index in cases where a composite wire includes substantially straight segmented wires connected across a plurality of tiles of routing graph 400. For example, in the embodiment shown in FIG. 6, the ordered pair (3, 1) refers to tile index 3 (e.g., tile 440C), and a master wire index 1 (e.g., master wire C1) of corresponding master tile 540. Advantageously, this alternative notation permits multiple segmented wires to reference a shared composite wire using similar ordered pairs. For example, as shown in FIG. 6, the fourth row of each of tables 640A-D includes the same ordered pair (3, 1).

Using tables 610, 640A-D, and 670, segmented wires of tiles 310, 340A-D, and 370 may be mapped to composite wires of tiles 410, 440A-D, and 470. For example, in Table 640B, the first row identifies a wire index of 0 (column S) associated with an ordered pair (−1, 3) (column C). Because table 640B is associated with tile template 240, the wire index of 0 corresponds to segmented wire S0 of template tile 240. Ordered pair (−1, 3) identifies a tile distance of one tile to the left of tile 440B to thus identify tile 440A, and a master wire index of 3 corresponding to master wire C3 of the master tile associated with tile 440A (i.e., master tile 540). This association indicates that the segmented wire of routing graph 300 which corresponds to segmented wire S0 of template tile 240 (i.e., segmented wire N8 of tile 340B) is part of the composite wire of routing graph 400 which corresponds to master wire C3 of master tile 540 (i.e., composite wire W4 of tile 440A).

Tables 610, 640A-D, and 670 may be used to provide master wire mapping tables 520, 550, and 580, respectively, of FIG. 5. In this regard, each of master wire mapping tables 520, 550, and 580 include rows (labeled "S") and columns (labeled "X"). Rows S identify wire indexes of segmented wires of tile templates 210, 240, and 270 corresponding to master tiles 510, 540, and 570, respectively. Columns X provide ordered pairs in the form previously discussed with regard to columns C of tables 610, 640A-D, and 670. Each of columns X of wire mapping tables 520, 550, and 580 include map indexes corresponding to the map indexes of tiles 410, 440A-D, and 470 of FIG. 4, respectively. Accordingly, it will be appreciated that master wire mapping tables 520 and 580 include the contents of tables 610 and 670, respectively, of FIG. 6. Similarly, master wire mapping table 550 includes the contents of tables 640A-D of FIG. 6.

Figure 7:
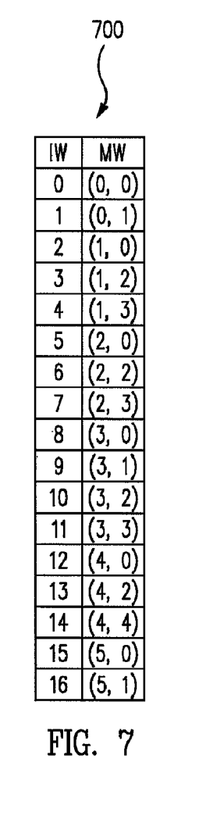
FIG. 7 illustrates a table for mapping single index representations of routing graph wires to multiple index representations of master wires in accordance with an embodiment of the invention.

FIG. 7 illustrates a table 700 for mapping single index representations of routing graph wires to multiple index representations of master wires in accordance with an embodiment of the invention. In particular, table 700 includes a column (labeled "IW") of wire indexes of wires W0-W16 of routing graph 400; and a column (labeled "MW") of ordered pairs used to identify master wires of master tiles 510, 540, and 570.

The ordered pairs of column MW may be in the form (g, h), wherein "g" corresponds to the tile index of the particular tile in which the wire of column IW resides (e.g., one of T0-T5), and wherein "h" identifies a master wire index of the wire in the one of master tiles 510, 540, or 570 corresponding to the wire of column IW.

For example, in table 700, wire W11 is associated with ordered pair (3, 3). The first number of the ordered pair indicates that wire W11 resides in tile 440C (e.g., having a tile index of T3). The second number of the ordered pair indicates that wire W11 of tile 440C is associated with master wire C3 of master tile 540 (e.g., the master tile associated with tile 440C).

Accordingly, by identifying a wire of routing graph 400 (e.g., a single index representation of a routing graph wire), the index of a corresponding tile of routing graph 400 may be returned (e.g., a first index) and a master wire of a master tile corresponding to the tile of routing graph 400 (e.g., a second index) may be returned.

Figure 8:
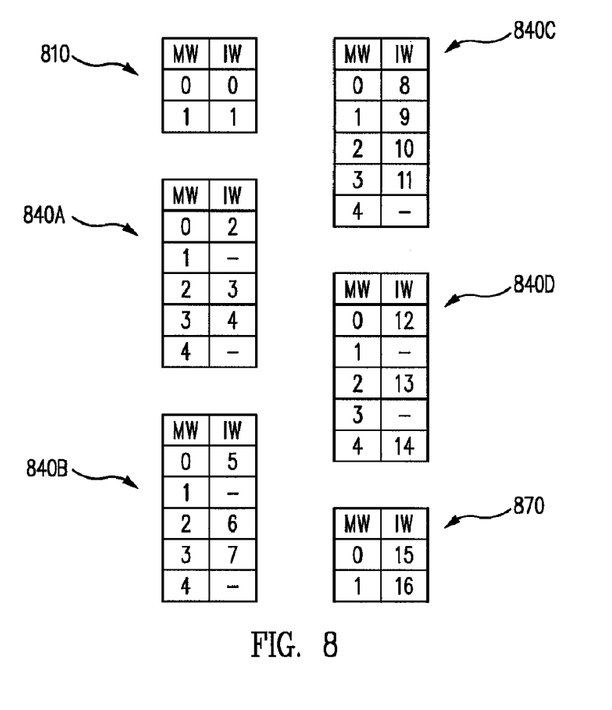
FIG. 8 illustrates a plurality of tables for mapping multiple index representations of master wires to single index representations of routing graph wires in accordance with an embodiment of the invention.

FIG. 8 illustrates a plurality of tables 810, 840A-D, and 870 for mapping multiple index representations of master wires to single index representations of wires in accordance with an embodiment of the invention. Tables 810, 840A-D, and 870, are associated with tiles 410, 440A-D, and 470, respectively, and master tiles 510, 540, and 570, respectively.

Each of tables 810, 840A-D, and 870 includes: a column (labeled "MW") of wire indexes of master wires of an associated master tile; and a column (labeled "IW") of wire indexes of wires W0-W16 of tiles 410, 440A-D, and 470 (e.g., which are associated with master tiles 510, 540, and 570, respectively as previously discussed).

Using tables 810, 840A-D, and 870, a mapping may be performed from master wires of master tiles 510, 540, and 570 to wires W0-W16 of tiles 410, 440A-D, and 470. For example, using table 840D master wire C0 of master tile 540 may be mapped to wire W12 of tile 440D.

Accordingly, by identifying a particular one of tiles 410, 440A-D, or 470 (e.g., a first index) and a particular master wire of a master tile associated with the identified tile (e.g., a second index), a single index may be returned which corresponds to a wire of routing graph 400 (e.g., a single index representation of a wire).

Processor 124 of computing device 122 may be configured with appropriate software to conveniently identify connections between various segmented wires and composite wires of the various routing graphs described herein using various information set forth in FIGS. 2-8. Such identified connections may be advantageously used to determine available paths through connected wires and/or switches of a routing graph of a PLD.

Figure 9:
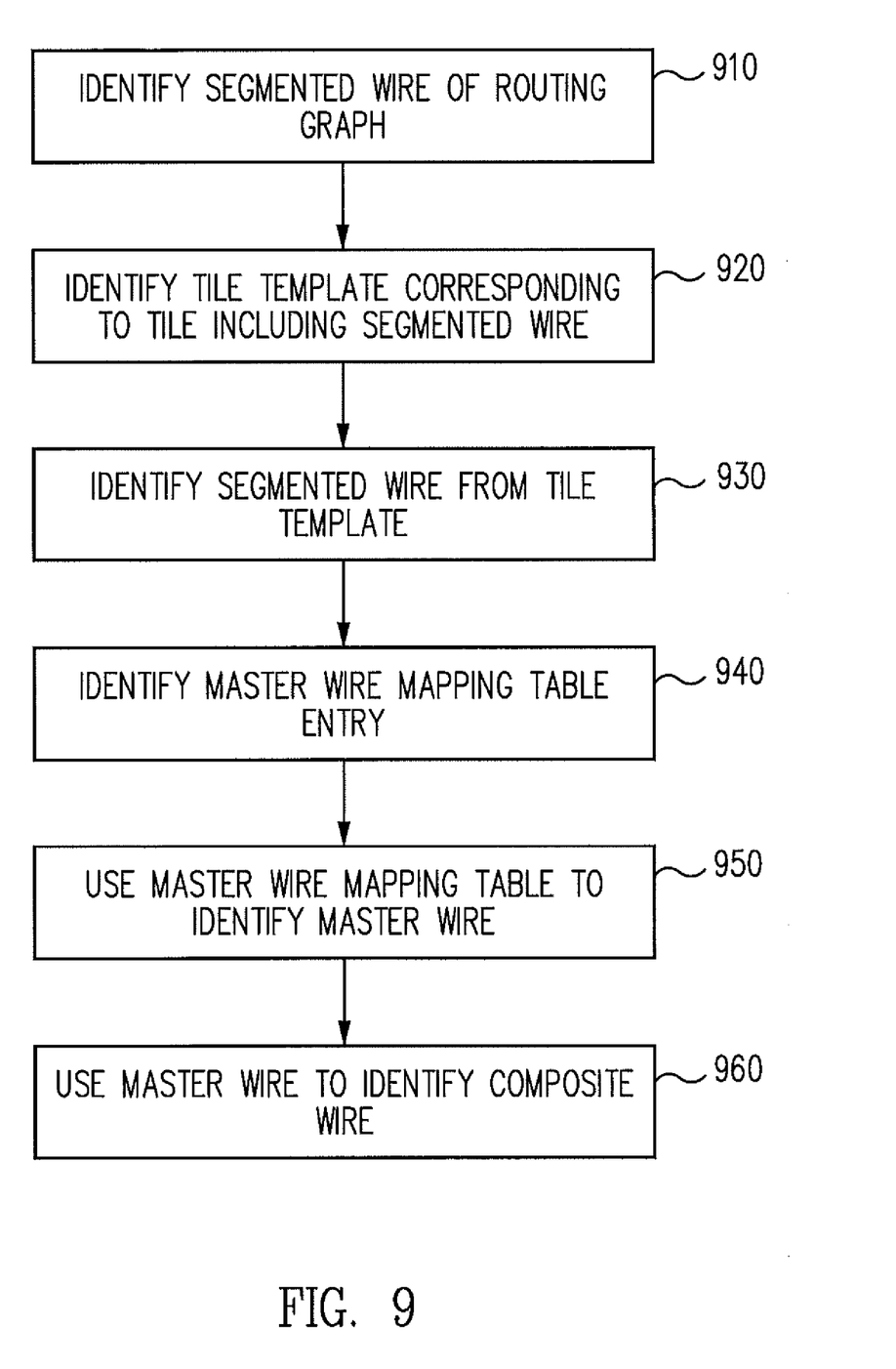
FIG. 9 illustrates a process of identifying a composite wire corresponding to a segmented wire in accordance with an embodiment of the invention.

For example, in one embodiment, processor 124 may be configured with appropriate software to identify a composite wire of a routing graph of which a given segmented wire is a part of. In this regard, FIG. 9 illustrates a process of identifying a composite wire corresponding to a segmented wire in accordance with an embodiment of the invention. In one embodiment, the process of FIG. 9 may be performed during step 1050 of the process of FIG. 10 further described herein.

In step 910, a segmented wire of a routing graph is identified. For example, in one embodiment, a segmented wire such as segmented wire N8 of tile 340B of routing graph 300 may be identified.

In step 920, a tile template corresponding to the tile including the segmented wire of step 910 is identified. In this regard, as identified in routing graph 300, tile template 240 was used to create tile 340B. Accordingly, tile template 240 will be identified in step 920 in this example.

In step 930, a segmented wire of the identified tile template corresponding to the segmented wire of step 910 is identified. Continuing the example above, segmented wire S0 of tile template 240 corresponds to segmented wire N8 of tile 340B and will therefore be identified in step 930 in this example.

In step 940, a master wire mapping table entry corresponding to a composite wire including the segmented wire of step 910 is identified. In this regard, the master wire mapping table associated with the master tile corresponding to the routing graph tile including the segmented wire of step 910 is identified.

In the example above, segmented wire N8 of tile 340B was identified in step 910. As previously discussed, tile 340B is associated with master tile 540. Accordingly, master wire mapping table 550 associated with master tile 540 will be used in step 940 in this example. Tile 440B corresponds to the layout provided by tile 340B, but with switches and wires renumbered. Accordingly, in this example, using the wire index of segmented wire S0 identified in step 930 (i.e., a wire index of 0) and the map index of tile 440B (i.e., a map index of 1 as shown in FIG. 4), a master wire mapping table entry corresponding to row 0, column 1 may be identified in step 940. As shown in master wire table 550, this entry provides an ordered pair (−1, 3).

In step 950, the ordered pair provided by the master wire mapping table entry identified in step 940 is used to identify a master wire. As previously described, the ordered pairs of master wire mapping tables 520, 550, and 580 are provided in the form of those of tables 610, 640A-D, and 670. Accordingly, the first number in the ordered pair identified in step 940 corresponds to a distance in numbers of tiles relative to the routing graph tile including the segmented wire. The second number in the ordered pair identified in step 940 corresponds to a master wire index of a master tile associated with the routing graph tile identified by the first number.

Continuing the example above, ordered pair (−1, 3) identifies a tile distance of one tile to the left of tile 440B (i.e., tile 440A is one tile to the left of tile 440B corresponding to tile 340B of routing graph 300 that includes segmented wire N8 identified in step 910). Ordered pair (−1, 3) also identifies a master wire index of 3. As previously described, tile 440A is associated with master tile 540. Accordingly, a master wire index of 3 in this example corresponds to master wire C3 of master tile 540.

In step 960, the master wire identified in step 950 is used to identify a composite wire corresponding to the segmented wire identified in step 910. In this regard, the master wire identified in step 950 corresponds to a composite wire of the routing graph tile referenced by the entry of the master wire mapping table identified in step 940. This composite wire is connected to the segmented wire identified in step 910.

Continuing the example above, master wire C3 of tile 540 was identified in step 950. In addition, tile 440A was identified by the entry of master wire mapping table 550 identified in step 940. Accordingly, master wire C3 of tile 540 corresponds to a composite wire of tile 440A. Upon inspection of FIGS. 4 and 5, it is apparent that master wire C3 of tile 540 corresponds to composite wire W4 of tile 440A. As a result, composite wire C3 of tile 440A is identified in step 960 a composite wire corresponding to segmented wire N8 identified in step 910. Upon inspection of FIGS. 3 and 4, it is evident that this is indeed the case.

Figure 10:
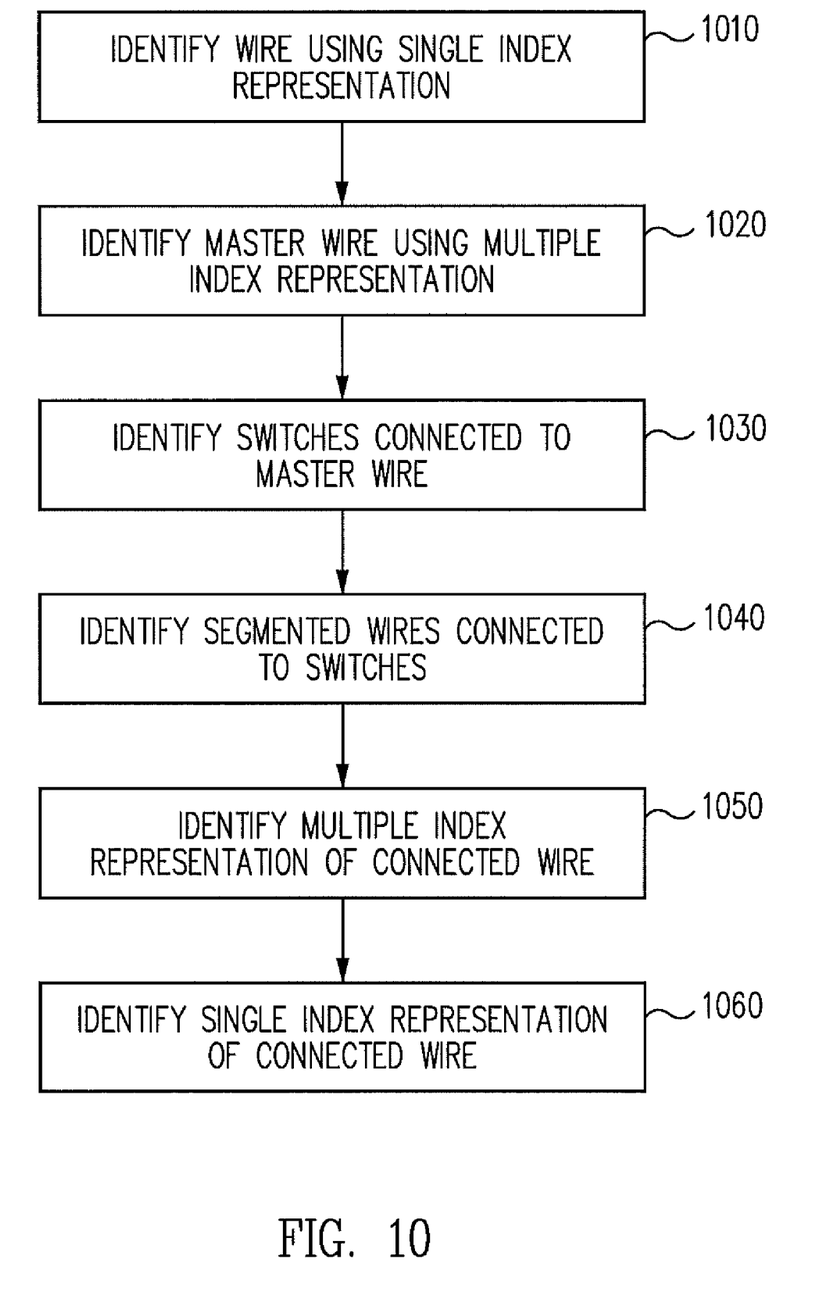
FIG. 10 illustrates a process of identifying connected wires in accordance with an embodiment of the invention.

In another embodiment, processor 124 may be configured with appropriate software to identify connected wires of routing graphs. In this regard, FIG. 10 illustrates a process of identifying a wire connected to another wire in accordance with an embodiment of the invention.

In step 1010, a wire of a routing graph is identified using a single index. For example, in one embodiment, composite wire W11 of tile 440C of routing graph 400 may be identified. In this regard, it will be appreciated that all wires of routing graph 400 are sequentially numbered. Accordingly, wire W11 may be identified by a single wire index (i.e., 11).

In step 1020, a master wire corresponding to the wire of step 1020 is identified using a multiple index representation. In this regard, table 700 of FIG. 7 may be used to map single index representations of wires to multiple index representations of master wires.

Continuing the example above, table 700 indicates that wire W11 is mapped to a master wire having a multiple index representation using the ordered pair (3, 3). As previously described in relation to FIG. 7, the first number of the ordered pair indicates that wire W11 resides in tile 440C (e.g., having a tile index of T3). The second number of the ordered pair indicates that wire W11 of tile 440C is associated with master wire C3 of master tile 540 (e.g., the master tile corresponding to tile 440C).

In step 1030, switches connected to the master wire of step 1020 are identified. In this regard, sets 515, 545, and 575 of FIG. 5 may be used to identify switches connected to master wires of master tiles 510, 540, and 570, respectively in the manner previously described with regard to FIG. 5.

Continuing the example above, set 545 associated with master tile 540 indicates that master wire C3 of master tile 540 is connected to three switches identified by ordered pairs: (0,1), (0, 2), and (1, 0). Ordered pair (0, 1) indicates that master wire C3 of master tile 540 is connected to a routing graph switch of tile 440C represented by master switch A1 of master tile 540. Ordered pair (0, 2) indicates that master wire C3 of master tile 540 is also connected to a routing graph switch of tile 440C represented by master switch A2 of master tile 540. Ordered pair (1, 0) indicates that master wire C3 of master tile 540 is further connected to a routing graph switch of tile 440D represented by switch A0 of master tile 540 (e.g., because tile 440D to the right of tile 440C corresponds to master tile 540).

In step 1040, segmented wires connected to the switches of step 1030 are identified. In this regard, sets 515, 545, and 575 of FIG. 5 may be used to identify wires connected to switches of master tiles 510, 540, and 570, respectively in the manner previously described with regard to FIG. 5.

Continuing the example above, set 545 associated with master tile 540 identifies that switch A0 of master tile 540 is represented by the ordered pair (0, 1). In view of the discussion of FIG. 5, it will be appreciated that ordered pair (0, 1) indicates that switch B11 of tile 440D (represented by master switch A0 of master tile 540) is connected to the wires of tile 440D that correspond to segmented wires S0 and S1 of template tile 240 of FIG. 2. Segmented wires connected to master switches A1 and A2 of master tile 540 may be similarly determined based on the previous discussion of FIG. 5.

In step 1050, a master wire mapping table is used to identify a wire corresponding to one of the segmented wires identified in step 1040 using a multiple index representation. In this regard, mapping tables 510, 540, and 570 may be used to identify a composite wire of which the segmented wires identified in step 1040 are a part. In one embodiment, step 1050 may be performed in accordance with the process of FIG. 9 described above.

Continuing the example above, segmented wire S1 identified in step 1040 and tile index 2 (corresponding to tile 440D as shown in FIG. 4) may be applied to master wire mapping table 550 to obtain ordered pair (0, 0). The first number of the ordered pair identifies tile 440D (i.e., a tile distance of 0 from tile 440D). The second number of the ordered pair identifies a master wire index of 0 which corresponds to master wire C0 of master tile 540 (i.e., the master tile associated with tile 440D). Together, the first and second numbers provide a multiple index representation of a master wire associated with a routing graph wire connected to the first wire identified in step 1010.

In step 1060, the multiple index representation of the wire determined in step 1050 and the tables of FIG. 7 are used to identify a single index representation of a routing graph wire connected to the first wire identified in step 1010.

Continuing the example above, as previously discussed, table 840D is associated with tile 440D identified in the multiple index representation obtained in step 1050. Master wire C0 also identified in the multiple index representation obtained in step 1050 is used to select the first row of table 840D (i.e., row 0). This row identifies a mapping between master wire C0 of master tile 540 to wire W12 (i.e., shown as 12 in table 840D) of tile 440D. As shown in FIG. 4, wire W12 is indeed connected to wire W11 previously identified in step 1010 (i.e., connected through routing graph switch B11).

In view of the present disclosure, it will be appreciated that various master tiles and tables described herein may be used to identify interconnections between various components of a PLD specified by routing graphs. Advantageously, by storing the information concerning such interconnections in the various master tiles and tables, such interconnections are not required to be explicitly specified in the routing graphs. Rather, such interconnections may be identified by referencing appropriate indexes of the various components using the master tiles and tables.

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method of referencing wires of a routing graph of a programmable logic device (PLD), wherein the routing graph comprises a plurality of routing graph wires and a plurality of routing graph switches corresponding to components of the PLD, the method comprising:
    maintaining in a computing system a plurality of master tiles comprising a plurality of master wires and a plurality of master switches corresponding to the routing graph wires and the routing graph switches, respectively;
    identifying in the computing system a first one of the routing graph wires; and
    mapping in the computing system the first routing graph wire to a second one of the routing graph wires using at least one of the master wires, wherein the first routing graph wire is a segmented wire of the PLD, the second routing graph wire is a composite wire of the PLD, and the composite wire comprises the segmented wire,
    wherein the mapping comprises:
        mapping the first routing graph wire to a master wire;
        mapping the first master wire to master switch;
        Identifying a segmented wire of the PLD connected to the master switch;
        mapping the segmented wire of the PLD to a second master wire; and
        mapping the second master wire to the second routing graph wire,
    wherein the second routing graph wire is connected to the first routing graph wire through at least one of the routing graph switches.

2. The method of claim 1, wherein the first routing graph wire is connected to the second routing graph wire through at least one of the routing graph switches.

3. The method of claim 1, wherein the mapping comprises:
    identifying a segmented wire of a tile template, wherein the segmented wire corresponds to the first routing graph wire;
    mapping the segmented wire to one of the master wires; and
    mapping the master wire to the second routing graph wire.

4. The method of claim 1, wherein the mapping comprises:
    mapping a single index representation of the first routing graph wire to multiple index representation of a first one of the master wires.

5. The method of claim 1, further comprising:
    maintaining a table comprising mappings between segmented wires of a tile template and composite routing graph wires of the PLD; and
    referencing the table during the mapping.

6. The method of claim 1, further comprising:
    maintaining a table comprising mappings between composite routing graph wires of the PLD and the master wires; and
    referencing the table during the mapping.

7. The method of claim 1, wherein the routing graph comprises a plurality of routing graph tiles, and each of the master tiles is associated with at least one of the routing graph tiles, the method further comprising;
    maintaining a plurality of tables comprising mappings between the master wires and composite routing graph wires of the PLD, wherein each of the tables is associated with a corresponding one of the routing graph tiles; and
    referencing at least one of the tables during the mapping.

8. A computing system comprising:
    one or more processors; and
    one or more memories adapted to store a plurality of computer readable instructions which when executed by the one or more processors are adapted to cause the system to perform a method of referencing wires of a routing graph of a programmable logic device (PLD), wherein the routing graph comprises a plurality of routing graph wires and a plurality of routing graph switches corresponding to components of the PLD, the method comprising:
        maintaining a plurality of master tiles comprising a plurality of master wires and a plurality of master switches corresponding to the routing graph wires and the routing graph switches, respectively,
        identifying a first one of the routing graph wires, and
        mapping the first routing graph wire to a second one of the routing graph wires using at least one of the master wires, wherein the first routing graph wire is a segmented wire of the PLD, the second routing graph wire is a composite wire of the PLD, and the composite wire comprises the segmented wire,
    wherein the mapping comprises:
        mapping the first routing graph wire to a first one of the master wires;
        mapping the first master wire to at least one of the master switches;
        identifying a segmented wire of the PLD connected to the master switch;
        mapping the segmented wire of the PLD to a second master wire; and
        mapping the second master wire to the second routing graph wire,
    wherein the second routing graph wire is connected to the first routing graph wire through at least one of the routing graph switches.

9. The system of claim 8, wherein the first routing graph wire is connected to the second routing graph wire through at least one of the routing graph switches.

10. The system of claim 8, wherein the mapping comprises:
    identifying a segmented wire of a tile template, wherein the segmented wire corresponds to the first routing graph wire;
    mapping the segmented wire to one of the master wires; and
    mapping the master wire to the second routing graph wire.

11. The system of claim 8, wherein the mapping comprises:
    mapping a single index representation of the first routing graph wire to multiple index representation of a first one of the master wires.

12. The system of claim 8, wherein the method further comprises:

maintaining a table comprising mappings between segmented wires of a tile template and composite routing graph wires of the PLD; and referencing the table during the mapping.

13. The system of claim 8, wherein the method further comprises:

maintaining a table comprising mappings between composite routing graph wires of the PLD and the master wires; and referencing the table during the mapping.

14. The system of claim 8, wherein the routing graph comprises a plurality of routing graph tiles, and each of the master tiles is associated with at least one of the routing graph tiles, the method further comprising:

maintaining a plurality of tables comprising mappings between the master wires and composite routing graph wires of the PLD, wherein each of the tables is associated with a corresponding one of the routing graph tiles; and referencing at least one of the tables during the mapping.

15. A non-transitory computer readable medium on which is stored a computer program which when executed by a computing system performs a method of referencing wires of a routing graph of a programmable logic device (PLD), wherein the routing graph comprises a plurality of routing graph wires and a plurality of routing graph switches corresponding to components of the PLD, the method comprising:

maintaining in a computing system a plurality of master tiles comprising a plurality of master wires and a plurality of master switches corresponding to the routing graph wires and the routing graph switches, respectively;

identifying in the computing system a first one of the routing graph wires; and mapping in the computing system the first routing graph wire to a second one of the routing graph wires using at least one of the master wires, wherein the first routing graph wire is a segmented wire of the PLD, the second routing graph wire is a composite wire of the PLO, and the composite wire comprises the segmented wire, wherein the mapping comprises:

mapping the first routing graph wire to a master wire;

mapping the first master wire to master switch;

Identifying a segmented wire of the PLD connected to the master switch;

mapping the segmented wire of the PLO to a second master wire; and mapping the second master wire to the second routing graph wire.

wherein the second routing graph wire is connected to the first routing graph wire through at least one of the routing graph switches.

* * * * *